US009269902B2

(12) United States Patent
Wang

(10) Patent No.: US 9,269,902 B2
(45) Date of Patent: Feb. 23, 2016

(54) EMBEDDED RESISTORS FOR RESISTIVE RANDOM ACCESS MEMORY CELLS

(71) Applicant: Intermolecular Inc., San Jose, CA (US)

(72) Inventor: Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/140,660

(22) Filed: Dec. 26, 2013

(65) Prior Publication Data

US 2015/0188043 A1    Jul. 2, 2015

(51) Int. Cl.
*H01L 47/00* (2006.01)
*H01L 45/00* (2006.01)
*H01L 27/24* (2006.01)

(52) U.S. Cl.
CPC .............. *H01L 45/146* (2013.01); *H01L 45/08* (2013.01); *H01L 45/12* (2013.01); *H01L 45/1233* (2013.01); *H01L 45/145* (2013.01); *H01L 27/2409* (2013.01); *H01L 27/2463* (2013.01); *H01L 27/2481* (2013.01)

(58) Field of Classification Search
CPC .. H01L 45/1253; H01L 45/145; H01L 45/146
USPC ................. 257/4, E45.002, E45.003, E21.52; 438/900
See application file for complete search history.

(56) References Cited

U.S. PATENT DOCUMENTS

| | | | |
|---|---|---|---|
| 6,465,804 B1 | 10/2002 | Shamir | |
| 6,627,971 B1 | 9/2003 | Shen | |
| 6,946,673 B2 | 9/2005 | Zonca et al. | |
| 7,271,081 B2 | 9/2007 | Li | |
| 7,633,108 B2 | 12/2009 | Li | |
| 2004/0021991 A1* | 2/2004 | Horng et al. | 360/324.1 |
| 2007/0008773 A1 | 1/2007 | Scheuerlein | |
| 2010/0163825 A1* | 7/2010 | Dennison et al. | 257/3 |
| 2011/0062557 A1* | 3/2011 | Bandyopadhyay et al. | 257/616 |
| 2012/0074374 A1 | 3/2012 | Jo | |
| 2012/0127779 A1* | 5/2012 | Scheuerlein et al. | 365/148 |
| 2012/0140543 A1* | 6/2012 | Liu et al. | 365/100 |

(Continued)

OTHER PUBLICATIONS

Nardi, F., et al.; Control of Filament Size and Reduction of Reset Current Below 10 uA in NiO Resistance Switching Memories; Jan. 1, 2011; Academia—Politecnico di Milano; SolidState Electronics pp. 4247.

(Continued)

*Primary Examiner* — Robert Huber

(57) ABSTRACT

Provided are resistive random access memory (ReRAM) cells and methods of fabricating thereof. The ReRAM cells may include a first layer operable as a bottom electrode and a second layer operable to switch between a first resistive state and a second resistive state. The ReRAM cells may include a third layer that includes a material having a lower breakdown voltage than the second layer and further includes a conductive path created by electrical breakdown. The third layer may include any of tantalum oxide, titanium oxide, and zirconium oxide. Moreover, the third layer may include a binary nitride or a ternary nitride. The binary nitrides may include any of tantalum, titanium, tungsten, and molybdenum. The ternary nitrides may include silicon or aluminum and any of tantalum, titanium, tungsten, and molybdenum. The ReRAM cells may further include a fourth layer operable as a top electrode.

8 Claims, 6 Drawing Sheets

(56) References Cited

U.S. PATENT DOCUMENTS

2012/0313063 A1* 12/2012 Wang et al. .................. 257/2
2013/0026438 A1    1/2013 Wang

OTHER PUBLICATIONS

Tirano, S., et al.; Accurate Analysis of Parasitic Current Overshoot During Forming Operation in RRAMs; Jan. 1, 2011; CEA-LETI, France; Microelectronic Engineering pp. 11291132.

Lee et al.; MultiLevel Switching of TripleLayered TaOx RRAM with Excellent Reliability for Storage Class Memory; Jan. 1, 2012; 2012 Symposium on VLSI Technology Digest of Technical Papers.

Chen, A.; Current Overshoot During Set and Reset Operations of Resistive Switching Memories; Jan. 1, 2012; IEEE; pp. MY0201MY02.4.

Nardi, F., et al.; Reset Current Reduction and SetReset Instabilities in Unipolar NiO RRAM; Jan. 1, 2011; IEEE; 4 pages.

* cited by examiner

Initial Forming ↓

↕ Operational Switching

US 9,269,902 B2

EMBEDDED RESISTORS FOR RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof. The ReRAM cells may include resistive switching nonvolatile memory elements that may include a first layer operable as a bottom electrode and a second layer operable to switch between at least a first resistive state and a second resistive state in response to an applied voltage. The resistive switching nonvolatile memory elements may also include a third layer that may include a material having a lower breakdown voltage than the second layer and further having a conductive path created by electrical breakdown. The resistive switching nonvolatile memory elements may also include a fourth layer operable as a top electrode. In some embodiments, the third layer includes one of tantalum oxide, titanium oxide, and zirconium oxide. Moreover, the third layer may include a binary nitride or a ternary nitride. The binary nitride may include a metal that is one of tantalum, titanium, tungsten, and molybdenum, and the ternary nitride may include silicon or aluminum and a metal that is one of tantalum, titanium, tungsten, and molybdenum.

In some embodiments, the third layer has a thickness of between about 3 nm and 10 nm. Furthermore, the third layer may have a post-breakdown resistance of less than about 20 KOhms. Further still, the third layer may have a breakdown voltage of between about 3 Volts and 8 Volts. In some embodiments, the resistive switching nonvolatile memory elements further include a fifth layer operable as an intermediate electrode. The fifth layer may be formed between the second layer and the third layer. Moreover, the fifth layer may directly interface the second layer and the third layer. In some embodiments, the fifth layer may include titanium nitride. Furthermore, the second layer may include one of hafnium oxide, titanium oxide, strontium titanium oxide, and hafnium silicon oxide. According to some embodiments, the first layer and the fourth layer may include titanium nitride.

Also disclosed herein are methods for forming resistive switching nonvolatile memory elements. The methods may include forming a first layer operable as a bottom electrode and forming a second layer operable to switch between at least a first resistive state and a second resistive state in response to an applied voltage. The methods may also include forming a third layer that includes a material having a lower breakdown voltage than the second layer. The methods may further include forming a fourth layer operable as a top electrode and forming a fifth layer operable as an intermediate electrode between the second layer and the third layer. The fifth layer may directly interface the second layer and the third layer.

In some embodiments, the third layer may operate as a sacrificial layer to protect the second layer during the "forming operation," in which a voltage is applied to create one or more initial conductive filaments through the second layer. If these filaments are too thick or dense, the reset voltages applied during operation may be unable to break them as required to rewrite the ReRAM cell. The breakdown of the third layer, however, occurs before such irreversible filaments can be formed in the second layer.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
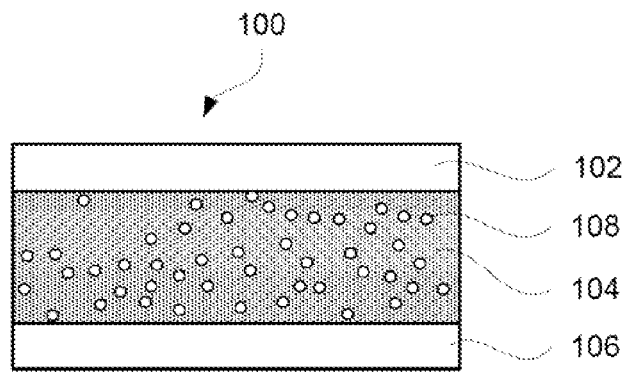
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the variable resistance layer is a dynamic process that needs to be well controlled to prevent over-programming. For example, when the variable resistance layer is switched from its high resistive state (HRS) to its low resistive state (LRS), a rapid drop in resistance associated with this switch may cause an excessive current through the variable resistance layer and an over-programming. The over-programming occurs when change in the resistance continues even after the variable resistance layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

The variable resistance layer may be made of a dielectric material that exhibits resistive switching characteristics in which the dielectric material can be made to conduct through one or more conductive paths formed after the application of a voltage, such as a forming voltage. As discussed with reference to FIG. 1A, before the forming operation the variable resistance layer may include substantially no defects. Alternatively, the initial distribution of defects in the variable resistance layer may be so unlike a filament (e.g., randomly distributed through the bulk or concentrated near one of the interfaces) that a high forming voltage is required to re-orient the defects into a filament. During the forming operation, the applied voltage creates an electric field that mobilizes defects so that they are provided (e.g., from an adjacent layer such as a source electrode or a defect-access layer) and/or redistributed to form a conductive path (the filament).

Ideally, the filament can subsequently be broken and re-formed by applying reset and set voltages, respectively. However, if the forming voltage is too high or is applied for too long, the filament may become too thick or dense to be broken during a reset. For practical purposes, in the context of operating the ReRAM cell, the filament is irreversible and the cell cannot be written. In some cases, the cell could be written by using more set and reset power, but in some applications the use of more power may be undesirable. Because the initial number, density, and distribution of defects typically varies from cell to cell, the forming voltage pulse characteristics required to form a reversible filament, and the difference between that pulse and a pulse that would form an irreversible filament, also vary. Therefore, the same forming pulse that forms a reversible filament in one cell may form an irreversible filament in another cell or may fail to form any filament in a third cell. Consequently, irreversible breakdown of the variable resistance layer may occur during the forming operation which may result in operational currents and voltages that are relatively high and undesirable for low voltage operation of the ReRAM cells.

As disclosed herein, a sacrificial protective layer is included within ReRAM cells to protect the variable resistance layer from irreversible breakdown during the application of a forming voltage. "Sacrificial layer" and "protective layer" are used interchangeably herein. The protective layer may include a layer that has a lower breakdown voltage than the variable resistance layer. Moreover, the protective layer may also have a conductance that is determined based on a target operational current amplitude. This target operational current is used during the operation of the ReRAM cell and after the application of the forming voltage. Accordingly, during the application of a forming voltage to the ReRAM cell, once a conductive path is formed in the variable resistance layer, the applied voltage may be dropped almost entirely across the protective layer. In this way, once a conductive path has been formed in the variable resistance layer, the protective layer may absorb the applied voltage and break down, thus sacrificing itself during the application of the forming voltage. In some embodiments, the application of the forming voltage may be terminated in response to the breakdown of the protective layer (for example, in response to a rapid increase in output current observed when the layer breaks down), thus preventing the irreversible breakdown of the variable resistance layer. Some examples of materials that may be included the protective layer are leaky metal oxides, such as tantalum oxide, titanium oxide, and zirconium oxide. The protective layer may also include binary nitrides or ternary nitrides, such as binary nitrides that include a metal that is one of tantalum, titanium, tungsten, and molybdenum, and ternary nitrides that include silicon or aluminum and a metal that is one of tantalum, titanium, tungsten, and molybdenum. These and other features will be discussed in greater detail below.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the variable resistance layer and, in some embodiments, across one interface formed by the resistive switching voltage, when a switching voltage is applied to the layer.

FIG. 1A illustrates a schematic representation of ReRAM cell 100 including first electrode 102, second electrode 106, and variable resistance layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the variable resistance layer. That is, defects may travel through an interface formed by this electrode with the variable resistance layer (i.e., the reactive interface).

Variable resistance layer 104 which may be initially formed from a dielectric material and later can be made to conduct through one or more conductive paths formed within the layer by applying first a forming voltage and then a switching voltage. To provide this resistive switching functionality, variable resistance layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Variable resistance layer 104 may include some defects 108. Additional defects 108 may be provided within first electrode 102 and may be later transferred to variable resistance layer 104 during the formation operation. In some embodiments, the variable resistance layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and variable resistance layer 104 during forming and/or switching operations.

Figure 1B:
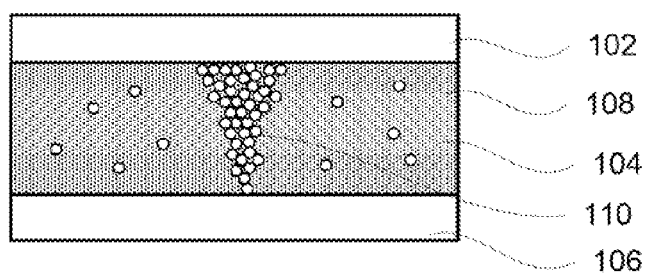
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within variable resistance layer 104 as, for example, schematically illustrated in FIG. 1B. Without being restricted to any particular theory, it is believed that defects 108 can be reoriented within variable resistance layer 104 to form these conductive paths as, for example, schematically shown in FIG. 1B. Furthermore, some or all defects 108 forming the conductive paths may enter variable resistance layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
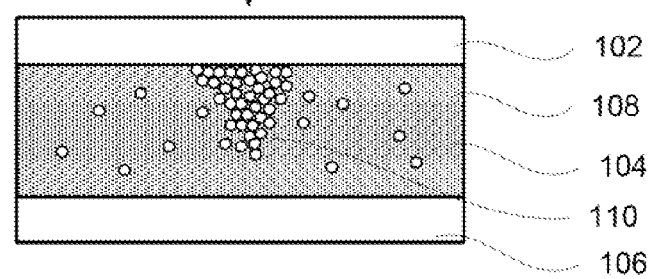

Resistive switching involves breaking and reforming conductive paths through variable resistance layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of variable resistance layer 104 illustrated in FIG. 1B is referred to as a low resistive state (LRS), while the state illustrated in FIG. 1C is referred to as a high resistive state (HRS). The resistance difference between the LRS and HRS is due to different number and/or conductivity of conductive paths that exists in these states, i.e., variable resistance layer 104 has more conductive paths and/or less resistive conductive paths when it is in the LRS than when it is in the HRS. It should be noted that variable resistance layer 104 may still have some conductive paths while it is in the HRS, but these conductive paths are fewer and/or more resistive than the ones corresponding to the LRS.

When switching from its LRS to HRS, which is often referred to as a reset operation, variable resistance layer 104 may release some defects into first electrode 102. Furthermore, there may be some mobility of defects within variable resistance layer 104. This may lead to thinning and, in some embodiments, breakages of conductive paths as shown in FIG. 1C. Depending on mobility within variable resistance layer 104 and diffusion through the interface formed by variable resistance layer 104 and first electrode 102, the conductive paths may break closer to the interface with second electrode 106, somewhere within variable resistance layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, variable resistance layer 104 may receive some defects from first electrode 102. Similar to the reset operation described above, there may be some mobility of defects within variable resistance layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
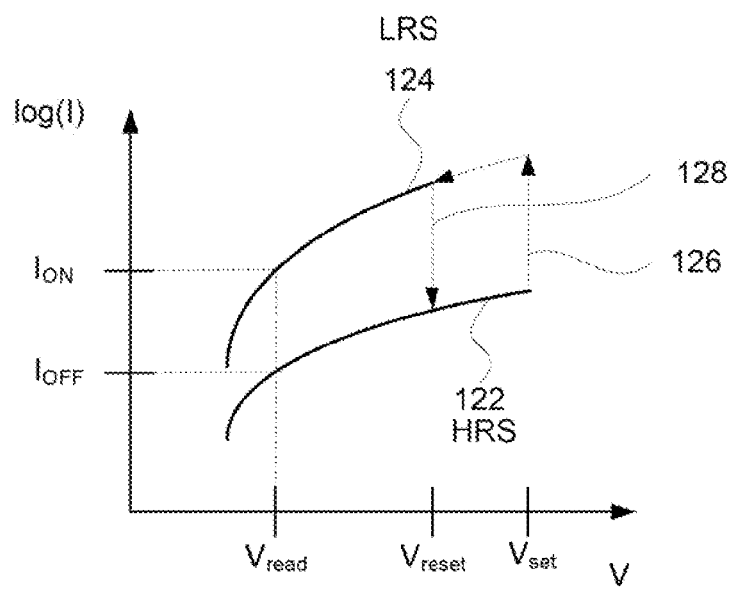
FIG. 2A illustrates a plot of a current passing through a unipolar ReRAM cell as a function of a voltage applied to the ReRAM cell, in accordance with some embodiments.
Figure 2B:
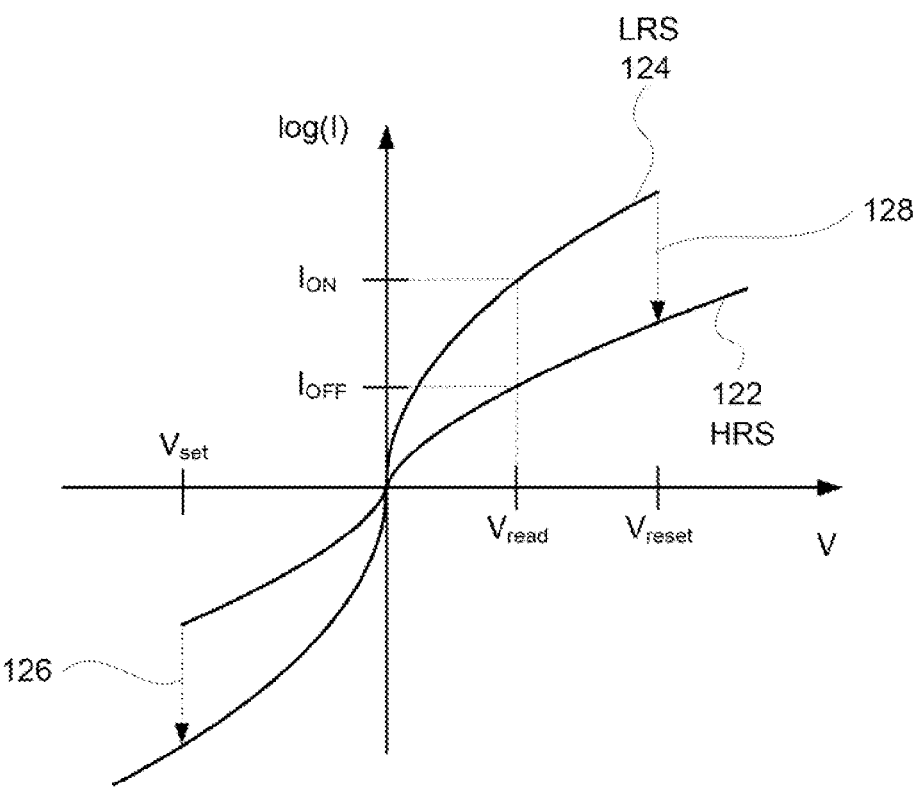
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistive states may be used to store one bit of data. It should be noted that some ReRAM cells may have three and even more resistive states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of variable resistance layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the variable resistance layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the variable resistance layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of ReRAM Cells

Figure 3:
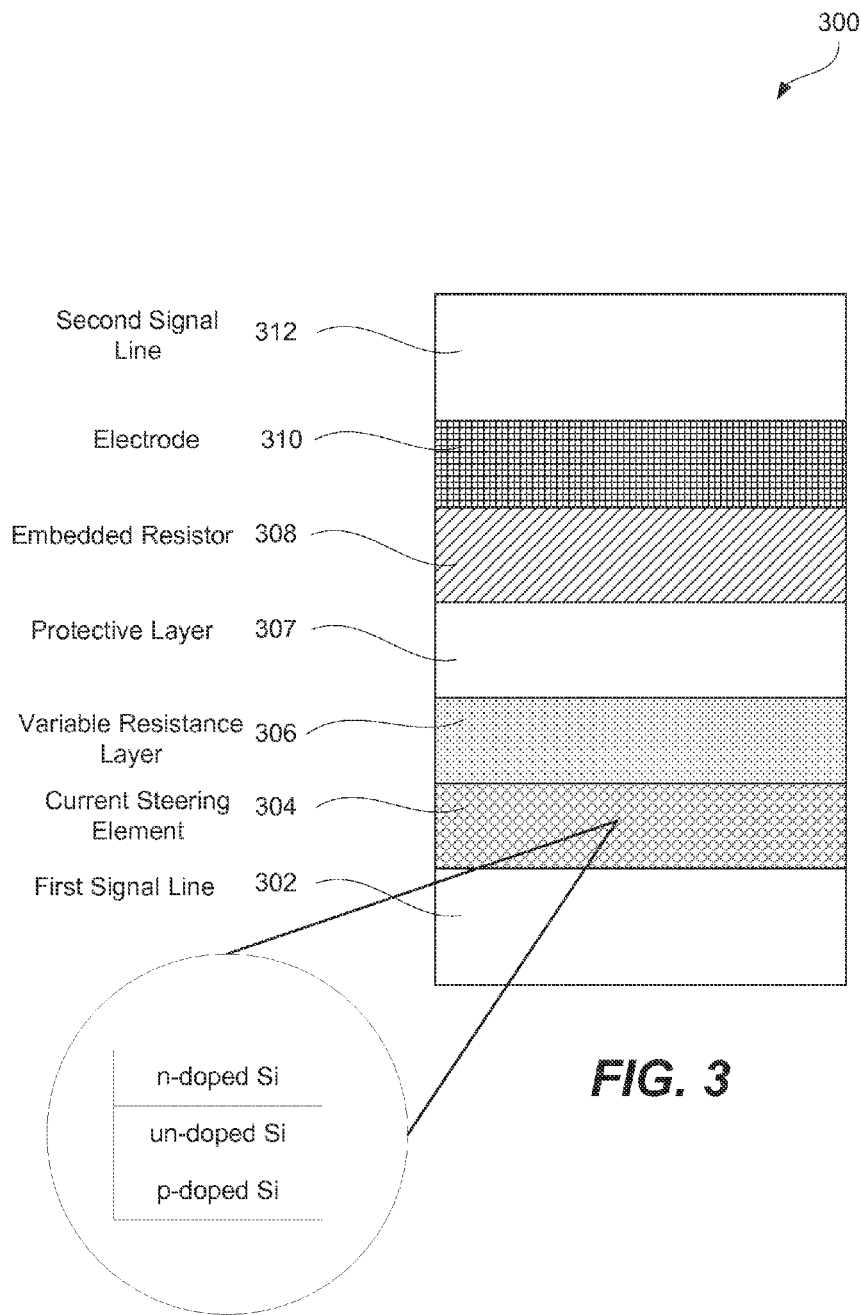
FIG. 3 illustrates a schematic representation of a ReRAM cell including an embedded resistor, a variable resistance layer, a protective layer, and other components, in accordance with some embodiments.

FIG. 3 illustrates a schematic representation of a ReRAM cell including an embedded resistor, a variable resistance layer, a protective layer, and other components, in accordance with some embodiments. ReRAM cell 300 may include a first signal line 302, a current steering element 304, a variable resistance layer 306, a protective layer 307, an embedded resistor 308, an electrode 310, and a second signal line 312. The "first" and "second" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 310 and embedded resistor 308 in order to improve electrical connection between electrode 310 and embedded resistor 308. Furthermore, current steering element 304 and/or intermediate electrode 310 may be omitted from ReRAM cell 300.

In the example illustrated in FIG. 3, a portion of current steering element 304 is also operable as another intermediate electrode interfacing variable resistance layer 306. Likewise, when intermediate electrode 310 is not present, a portion of embedded resistor 308 may be operable as an intermediate electrode. In some embodiments, variable resistance layer 306 is positioned in between and directly interfaces two electrodes. Regardless of these configurations, one electrode (standalone or a part of another component) interfacing variable resistance layer 306 may be an inert electrode and may not exchange defects with variable resistance layer 306. Another electrode (standalone or a part of another component) that also interfaces variable resistance layer 306 may be active and may act as a "source electrode" to exchange defects with variable resistance layer 306. For example, a titanium nitride electrode may accept and release oxygen vacancies into variable resistance layer 306, while a doped polysilicon electrode may form a passivation silicon oxide layer that blocks defects from going in and out of variable resistance layer 306. In the example illustrated in FIG. 3, current steering element 304 may include a bottom p-doped polysilicon portion, which interfaces second signal line 302, a top n-doped polysilicon portion, which interfaces variable resistance layer 306 and is operable as an electrode, more specifically, an inert electrode.

In some embodiments, the electrodes may be sufficiently conductive and may be used as signal lines. Alternatively, signal lines and electrodes may be separate components as, for example, illustrated in FIG. 3. First signal line 302 and second signal line 312 may provide electrical connections to ReRAM cell 300. For example, first signal line 302 and/or second signal line 312 may extend between multiple ReRAM cells, which may be cells provided in the same row or the same column of a memory array as further described below with reference to FIGS. 6A and 6B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, transistor, or other similar device disposed between first signal line 302 and second signal line 312. As such, current steering element 304 is connected in series with variable resistance layer 306. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride.

Variable resistance layer 306 can be fabricated from a dielectric material, such as a metal oxide material or other similar material that can be switched between two or more stable resistive states. In some embodiments, variable resistance layer 306 is fabricated from a high bandgap material, e.g., a material that has a bandgap of at least about 4 electron Volts. Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in ReRAM cell 300 and reduce the current leakage, since the amount of trapped charge in these materials is less than in a lower bandgap material. Furthermore, the high bandgap materials create a large barrier height for the carriers to cross during the read, set, and reset operations. Other suitable materials for variable resistance layer 306 include titanium oxide ($TiO_x$), nickel oxide ($NiO_x$), and cerium oxide ($CeO_x$). Furthermore, semi-conductive metal oxide (p-type or n-type), such as zinc oxides ($Zn_xO_y$), copper oxides ($Cu_xO_y$), and their nonstoichiometric and doped variants can be used for variable resistance layer 306.

In some embodiments, variable resistance layer 306 includes a dopant that has an affinity for oxygen, such as various transition metals (e.g., aluminum, titanium, and zirconium), to form a metal-rich variable resistance layer, such as a non-stoichiometric oxide (e.g., $HfO_{1.5}$-$HfO_{1.9}$ or, more specifically, $HfO_{1.7}$). The dopant may be the same material as a metal of the base oxide (e.g., $HfO_2$ doped with hafnium) or different (e.g., $HfO_2$ doped with aluminum, titanium, and zirconium). Oxygen deficiency of the metal-rich variable resistance layer corresponds to a number of oxygen vacancies, which are believed to be defects responsible for resistive switching. The amount of defects is controlled to achieve certain switching and forming voltages, operating currents, improve performance consistency and data retention.

Variable resistance layer 306 may have a thickness of between about 1 nm to about 100 nm, such as between about 2 nm and 20 nm or, more specifically, between about 5 nm and 10 nm. Thinner variable resistance layers may be deposited using ALD, while thicker variable resistance layers may be deposited using may be deposited using ALD as well as physical vapor deposition (PVD) and, in some embodiments, chemical vapor deposition (CVD).

Embedded resistor 308 may be fabricated from one of metal oxides, metal oxynitrides, metal silicon nitrides, metal silicon oxynitrides, metal aluminum nitrides, metal aluminum oxynitrides, metal boron nitrides, or metal boron oxynitrides. Specific examples of materials suitable for embedded resistor 308 include hafnium oxide, tantalum oxide, aluminum oxide, lanthanum oxide, yttrium oxide, dysprosium oxide, ytterbium oxide, zirconium oxide, titanium oxide, hafnium oxynitride, zirconium oxynitride, tantalum oxynitride, and titanium oxynitride. In some embodiments, embedded resistor 308 provides a substantially constant resistivity when a field of up to about 12 Mega-Volts per centimeter or, more specifically, up to about 8 Mega-Volts per centimeter is applied to embedded resistor 308. For purposes of this disclosure, the substantially constant resistivity is defined as a resistivity that changes by less than one order of magnitude (i.e., less than about a factor of 10). In some embodiments, the resistivity of the material forming embedded resistor 308 is between about 0.1 Ohm-centimeter to 40 Ohm-centimeter or, more specifically, between about 1 Ohm-centimeter to 4 Ohm-centimeter. In some embodiments, embedded resistor 308 has a thickness of between about 5 nm and 10 nm. More specifically, embedded resistor 308 may have a thickness of between about 3 nm and 8 nm. Moreover, a footprint (i.e., cross-sectional area) of embedded resistor 308 may be between about 20 nanometers-square and 100 nanometers-square or, more specifically, between about 30 nanometers-square and 60 nanometers-square, such as about 60 nanometers-square.

According to some embodiments, ReRAM cell 300 includes protective layer 307. In some embodiments, protective layer 307 may be formed between variable resistance layer 306 and embedded resistor 308. In some embodiments, protective layer 307 may directly interface variable resistance layer 306 and embedded resistor 308. According to some embodiments, ReRAM cell 300 may include protective layer 307 instead of embedded resistor 308. Therefore, while FIG. 3 illustrates ReRAM cell 300 as including embedded resistor 308, in some embodiments, ReRAM cell 300 does not include embedded resistor 308, and protective layer 307 directly interfaces electrode 310, discussed in greater detail below.

According to some embodiments, a material included in protective layer 307 may be determined or selected based on a material included in variable resistance layer 306, and may be configured to include a material that has a lower breakdown voltage than a material included in variable resistance layer 306. Thus, during the application of a forming voltage to ReRAM cell 300, a weak or reversible conductive path may be formed within variable resistance layer 306. In some embodiments, a reversible conductive path may refer to a conductive path that may be broken in response to the application of a reset voltage to ReRAM cell 300. Moreover, an irreversible conductive path may refer to a conductive path that cannot be broken despite the application of a reset voltage to ReRAM cell 300. Once such a reversible conductive path has been formed within variable resistance layer 306, substantially all of the forming voltage may be dropped across protective layer 307 and cause breakdown of protective layer 307.

Because protective layer 307 has a lower breakdown voltage than variable resistance layer 306, it may form a conductive path during the application of the forming voltage to ReRAM cell 300 prior to the formation of an irreversible conductive path within variable resistance layer 306. Thus, protective layer 307 may experience an irreversible breakdown, while variable resistance layer 306 does not, and only experiences a reversible breakdown. According to some embodiments, the breakdown of protective layer 307 forms a conductive path and causes a measurable increase in the current passing through ReRAM cell 300. As discussed in greater detail below with reference to FIG. 5, this increase in current or current spike may be used as a signal to trigger the termination of the application of the forming voltage to ReRAM cell 300, thus preventing further and irreversible breakdown of variable resistance layer 306. In this way, the irreversible breakdown of protective layer 307 may prevent the irreversible breakdown of variable resistance layer 306 and maintain optimal current/voltage characteristics of variable resistance layer 306 during low voltage operation of ReRAM cell 300. In some embodiments, when protective layer 307 is configured in this way, protective layer 307 may have a breakdown voltage of between about 3 Volts and 8 Volts, which may be less than a breakdown voltage of variable resistance layer 306.

In some embodiments, protective layer 307 may include a metal oxide, such as tantalum oxide, titanium oxide, and zirconium oxide. According to some embodiments, protective layer 307 may include a binary nitride or a ternary nitride. For example, the binary nitride may include any of tantalum, titanium, tungsten, and molybdenum. Moreover, the ternary nitride may include silicon or aluminum and a metal that is any of tantalum, titanium, tungsten, and molybdenum. Furthermore, protective layer 307 may have a conductance that is configured or determined based on an operational read current and a reset current of ReRAM cell 300. For example, protective layer 307 may have a thickness and material selected or configured to be highly conductive and have little electrical resistance after the application of the forming voltage to ReRAM cell 300 and irreversible breakdown of protective layer 307, and during the application of an operational voltage or current, such as a read current or reset current. For example, protective layer 307 may have a post-breakdown resistance of less than about 20 KOhms after the forming operation. For example, protective layer 307 may have a post-breakdown resistance of about 10 KOhms after the forming operation. In some embodiments, variable resistance layer 306 may have an operational or switching resistance of about 100 KOhms. Accordingly, after the forming operation, the post-breakdown resistance of protective layer 307 may be substantially less than the switching resistance of variable resistance layer 306. In some embodiments, protective layer 307 may be configured to have a post-breakdown resistance that is relatively small at operational currents and voltages. For example, if ReRAM cell 300 will be used with a read current of between about 50 nA and 500 nA, a material included in and one or more dimensions of protective layer 307 may be configured such that protective layer 307 has a post-breakdown resistance of about 10 KOhms.

Electrode 310 may be fabricated from a conductive material that has a desirable conductivity, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Figure 4:
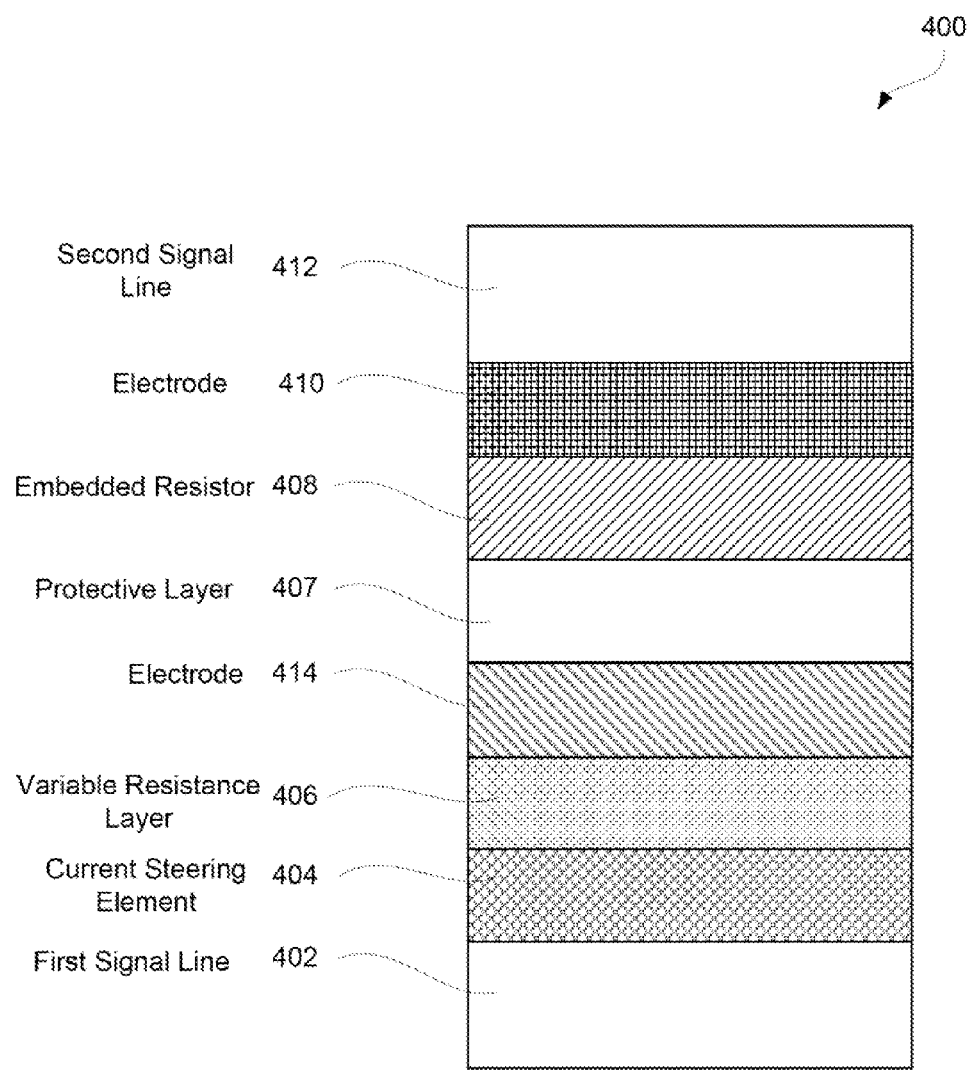
FIG. 4 illustrates a schematic representation of another ReRAM cell including an embedded resistor, a variable resistance layer, a protective layer, and other components, in accordance with some embodiments.

FIG. 4 illustrates a schematic representation of another ReRAM cell including an embedded resistor, a variable resistance layer, a protective layer, and other components, in accordance with some embodiments. As similarly discussed with reference to FIG. 3, a ReRAM cell, such as ReRAM cell 400, may include first signal line 402, current steering element 404, variable resistance layer 406, protective layer 407, embedded resistor 408, electrode 410, and second signal line 412. In some embodiments, ReRAM cell 400 may also include an intermediate electrode, such as electrode 414, which may include a metal nitride, such as titanium nitride. In some embodiments, the inclusion of electrode 414 may promote or increase electrical coupling between variable resistance layer 406 and protective layer 407. As similarly discussed above with reference to FIG. 3, a material included in protective layer 407 may be determined or selected based on a material included in variable resistance layer 406, and may be configured to include a material that has a lower breakdown voltage than a material included in variable resistance layer 406. For example, protective layer 407 may include a material that has a breakdown voltage of between about 3 Volts and 8 Volts, which may be less than a breakdown voltage of variable resistance layer 406.

Processing Examples

Figure 5:
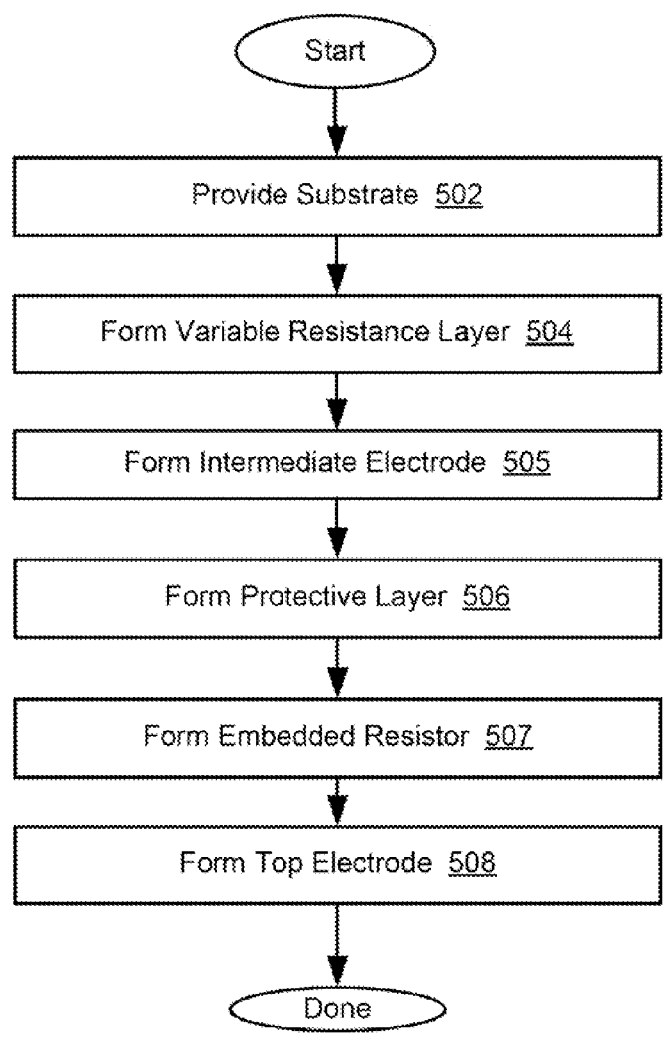
FIG. 5 illustrates a process flowchart corresponding to a method of fabricating a ReRAM cell, in accordance with some embodiments.

FIG. 5 illustrates a process flowchart corresponding to a method of fabricating a ReRAM cell, in accordance with some embodiments. Method 500 may commence with providing a substrate during operation 502. The substrate may include one or more components, such as a first signal line, a first electrode, and a current steering element. In other embodiments, method 500 involves forming the first signal line, the first electrode and/or, for example, the current steering element on the substrate, either of which may be operable as an electrode. The signal line can be made of silicon (e.g., doped polysilicon), a silicide, titanium nitride, or other appropriate materials listed elsewhere in this document. For example, a titanium nitride layer may be formed using PVD or other suitable deposition techniques. Deposition of the titanium nitride layer may be performed using a titanium target in a nitrogen atmosphere maintained at a pressure of between about 1-20 millitorr. The power may be maintained at 150-500 Watts/cm$^2$ with resulting in a deposition rate of about 0.05-0.5 nm per second. These process parameters are provided as examples and generally depend on deposited materials, tools, deposition rates, and other factors. Other processing techniques, such as ALD, PLD, CVD, evaporation, and the like can also be used to deposit the first signal line and, in some embodiments, the current steering element.

Method 500 may proceed with forming a variable resistance layer during operation 504. The variable resistance layer may be formed directly over the substrate or current steering element, if included. Thus, the variable resistance layer may directly interface the current steering element. In some embodiments, the embedded resistor may or may not be separated by one or more other layer, e.g., an interface layer that prevents diffusion of materials between the embedded resistor and the variable resistance layer. As similarly discussed above, the variable resistance layer may include a material, such as silicon oxide, and may have a thickness of about 1 nm. Any suitable deposition technique may be used to form the variable resistance layer, such as an atomic layer deposition (ALD) process or a physical vapor deposition (PVD) process. Other processing techniques, such as pulsed laser deposition (PLD), and chemical vapor deposition (CVD), evaporation, and the like may also be used to deposit the variable resistance layer.

Method 500 may proceed with forming an intermediate electrode during operation 505. The intermediate electrode layer may be formed directly over the variable resistance layer and may directly interface the variable resistance layer. The intermediate electrode may be made of a material such as a metal nitride. For example, the intermediate electrode may include titanium nitride. The intermediate electrode may be formed using any suitable deposition technique such as ALD, PVD, PLD, or CVD. In some embodiments, operation 506 may be performed optionally. For example, according to some embodiments, a ReRAM cell does not include an intermediate electrode and no intermediate electrode is formed during operation 506.

Method 500 may proceed with forming a protective layer during operation 506. Various examples of protective layers are described above with reference to FIG. 3. In some embodiments, the protective layer is formed from a metal oxide, such as tantalum oxide, titanium oxide, and zirconium oxide. Moreover, the protective layer may be formed from a binary nitride or a ternary nitride. For example the binary nitride may include a metal that is one of tantalum, titanium, tungsten, and molybdenum. Moreover, the ternary nitride may include silicon or aluminum and a metal that is one of tantalum, titanium, tungsten, and molybdenum. According to some embodiments, the protective layer is formed directly on the intermediate electrode, if included in the ReRAM cell, and the protective layer interfaces the intermediate electrode. In some embodiments, if no intermediate electrode is included, the protective layer may be formed on the variable resistance layer and may directly interface the variable resistance layer. Moreover, the embedded resistor may be formed using any suitable deposition technique such as ALD, PVD, PLD, or CVD.

Method 500 may proceed with forming an embedded resistor during operation 507. Various examples of embedded resistors are described above with reference to FIG. 3. In some embodiments, the embedded resistor is formed from one of metal oxides, metal oxynitrides, metal silicon nitrides, metal silicon oxynitrides, metal aluminum nitrides, metal aluminum oxynitrides, metal boron nitrides, or metal boron oxynitrides. According to some embodiments, the embedded resistor is formed directly on the protective layer and interfaces the protective layer. Moreover, the embedded resistor may be formed using any suitable deposition technique such as ALD, PVD, PLD, or CVD.

Method 500 may proceed with forming a top electrode during operation 508. The top electrode may be made from a conductive material that has a desirable conductivity, such as p-type polysilicon, n-type polysilicon, transition metals, transition metal alloys, transition metal nitrides, or transition metal carbides. For example, the third layer may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). The top electrode may have a thickness of between about 5 nm and about 500 nm. According to some embodiments, the top electrode is formed directly on the embedded resistor and interfaces the embedded resistor. Moreover, the top electrode may be formed using any suitable deposition technique such as ALD, PVD, PLD, or CVD.

Later, during the application of the forming voltage to the ReRAM cell, a reversible conductive path may be formed within the variable resistance layer. Moreover, a conductive path may be formed within the protective layer. As previously discussed, the lower breakdown voltage of the protective layer may result in irreversible breakdown of the protective layer before any irreversible breakdown of the variable resistance layer has the opportunity to occur.

In some embodiments, the irreversible breakdown of the protective layer forms a conductive path through the protective layer, measurably decreasing the overall electrical resistance of the ReRAM cell and accordingly increasing the current that passes through the ReRAM cell in response to the application of the forming voltage. A voltage source that is used to apply the forming voltage, or a controller associated with the voltage source, may be configured to detect the increase in current that results from the breakdown of the protective layer. Any suitable detection mechanism may be used, such as an edge detection circuit. The voltage source or its controller may be further configured to terminate the application of the forming voltage in response to detecting the increase in current. In this way, the forming voltage pulse may be terminated prior to the irreversible breakdown of the variable resistance layer.

Memory Array Examples

Figure 6A:
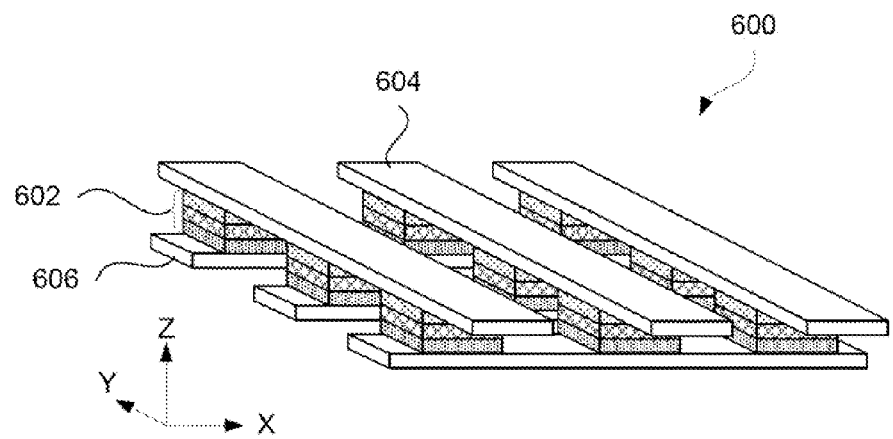
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as first and second electrodes, variable resistance layer, embedded resistors, embedded current steering elements, and the like, some of which are further described elsewhere in this document. In some embodiments, a ReRAM cell includes multiple variable resistance layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistive state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
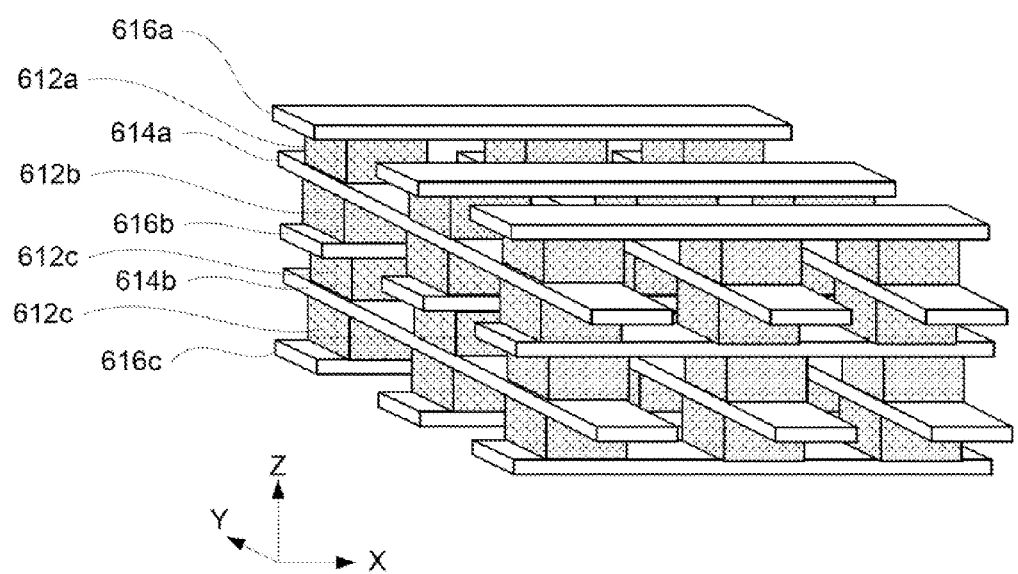

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. First and second sets of signal lines 616a and 616c are only used for making electrical connections to one array. This 3-D arrangement of the memory device should be distinguished from various 3-D arrangements in each individual ReRAM cell.

Conclusion

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive switching nonvolatile memory element comprising:
   a first signal line;
   a current steering element;
   a variable resistance layer operable to switch between at least a first resistive state and a second resistive state in response to an applied voltage;
      wherein the current steering element is a p-i-n diode comprising
         a bottom p-doped polysilicon portion interfacing the first signal line, and
         a top n-doped polysilicon portion interfacing the variable resistance layer;
   a protective layer having a lower breakdown voltage than the variable resistance layer and comprising a conductive path created by electrical breakdown;
      wherein the protective layer comprises one of lanthanum oxide, yttrium oxide, dysprosium oxide, ytterbium oxide, or cerium oxide; and
   a conductive electrode layer;
   a second signal line; and
   an intermediate layer,
   wherein the intermediate layer is formed between the variable resistance layer and the protective layer, and
      wherein the intermediate layer directly interfaces the variable resistance layer and the protective layer;
      wherein the intermediate layer comprises titanium nitride.

2. The resistive switching nonvolatile memory element of claim 1, wherein the protective layer has a thickness of between about 3 nm and 10 nm.

3. The resistive switching nonvolatile memory element of claim 1, wherein the protective layer has a post-breakdown resistance of less than about 20 KOhms.

4. The resistive switching nonvolatile memory element of claim 1, wherein the protective layer has a breakdown voltage of between about 3 Volts and 8 Volts.

5. The resistive switching nonvolatile memory element of claim 1, wherein the variable resistance layer comprises one of hafnium oxide, titanium oxide, strontium titanium oxide, or hafnium silicon oxide.

6. The resistive switching nonvolatile memory element of claim 1, wherein the current steering element and the conductive electrode comprise titanium nitride.

7. The resistive switching nonvolatile memory element of claim 1 further comprising a sixth layer formed between the protective layer and the conductive electrode, wherein the sixth layer has a substantially constant resistance.

8. The resistive switching nonvolatile memory element of claim 7, wherein the sixth layer comprises one of a metal oxide, a metal oxynitride, a metal silicon nitride, a metal silicon oxynitride, a metal aluminum nitride, a metal aluminum oxynitride, a metal boron nitride, or a metal boron oxynitride.

* * * * *